(12) United States Patent
Parson et al.

(10) Patent No.: US 6,950,963 B1
(45) Date of Patent: Sep. 27, 2005

(54) CONTROL METHOD AND APPARATUS FOR TESTING OF MULTIPLE PROCESSOR INTEGRATED CIRCUITS AND OTHER DIGITAL SYSTEMS

(75) Inventors: Dale E. Parson, Rockland Township, Berks County, PA (US); Bryan Schlieder, Bethlehem, PA (US); James C. Vollmer, Schnecksville, PA (US); Jay Patrick Wilshire, Pennsburg, PA (US)

(73) Assignee: Agere Systems Inc., Allentown, PA (US)

( * ) Notice: Subject to any disclaimer, the term of this patent is extended or adjusted under 35 U.S.C. 154(b) by 807 days.

(21) Appl. No.: 09/583,057

(22) Filed: May 30, 2000

(51) Int. Cl.⁷ .............................................. G06F 11/00
(52) U.S. Cl. ........................................ 714/30; 714/31
(58) Field of Search ............................. 714/11, 12, 30, 714/31

(56) References Cited

U.S. PATENT DOCUMENTS

| | | | | | |
|---|---|---|---|---|---|
| 4,135,240 | A | * | 1/1979 | Ritchie | 711/164 |
| 5,253,359 | A | * | 10/1993 | Spix et al. | 714/46 |
| 5,590,355 | A | * | 12/1996 | Shichiku et al. | 712/26 |
| 5,838,894 | A | * | 11/1998 | Horst | 714/11 |
| 6,028,983 | A | * | 2/2000 | Jaber | 714/30 |
| 6,065,078 | A | * | 5/2000 | Falik et al. | 710/100 |
| 6,108,699 | A | * | 8/2000 | Moiin | 709/221 |
| 6,173,386 | B1 | * | 1/2001 | Key et al. | 712/10 |
| 6,199,179 | B1 | * | 3/2001 | Kauffman et al. | 714/26 |
| 6,233,702 | B1 | * | 5/2001 | Horst et al. | 714/48 |
| 6,263,373 | B1 | * | 7/2001 | Cromer et al. | 709/250 |
| 6,311,302 | B1 | * | 10/2001 | Cassetti et al. | 714/727 |
| 6,334,198 | B1 | * | 12/2001 | Adusumilli et al. | 714/727 |
| 6,385,749 | B1 | * | 5/2002 | Adusumilli et al. | 714/733 |
| 6,421,741 | B1 | * | 7/2002 | Minyard | 709/400 |
| 6,425,101 | B1 | * | 7/2002 | Garreau | 714/727 |
| 6,629,268 | B1 | * | 9/2003 | Arimilli et al. | 714/42 |
| 6,633,909 | B1 | * | 10/2003 | Barrett et al. | 709/224 |
| 6,675,284 | B1 | * | 1/2004 | Warren | 712/38 |

OTHER PUBLICATIONS

D. Jaskolski, "How to Design an IDE for Debugging Multiprocessor DSP Systems," DSP Engineering, pp. 1-17, Jun. 2000.

Institute of Electrical and Electronics Engineers (IEEE) Standard 1149.1, "IEEE Standard Test Access Port and Boundary-Scan Architecture," IEEE, New York, NY, Oct. 1993.

Institute of Electrical and Electronics Engineers (IEEE) Standard 1149.1b, "Supplement to IEEE Standard Test Access Port and Boundary-Scan Architecture," IEEE, New York, NY, Mar. 1995.

(Continued)

*Primary Examiner*—Nadeem Iqbal
*Assistant Examiner*—Timothy M. Bonura (57) ABSTRACT

An integrated circuit or other type of digital system including multiple processors is tested using a control mechanism which dynamically defines a group of processors subject to common control. The control mechanism receives one or more commands for each of the processors in the group, and delays issuance of one or more of the commands for the group until a designated group scan command is received for each of the processors in the group. The control mechanism may be in the form of a software-implemented chain manager which provides the above-noted group definition, command receipt and issuance delay operations, and subsequently delivers one or more of the test commands as a single serial bit stream to an IEEE 1149.1 hardware scan chain associated with the processors. The control mechanism can provide synchronous control for a group of homogeneous processors of the digital system, or pseudo-synchronous control for a group of heterogeneous processors of the digital system.

20 Claims, 5 Drawing Sheets

OTHER PUBLICATIONS

L. Goudge, "Debugging Embedded Systems," ARM White Paper, www.arm.com, 6 pages, 1998.

ScanProgrammer Product Information, ASSET InterTech, www.asset-intertech.com, 37 pages, Mar. 2000.

Advanced Tutorial: Using the MVP Multiprocessing Features, Chapter 3, www.ti.com, pp. 3-1 through 3-17, undated.

Using the Parallel Debug Manager, Chapter 11, www.ti.com, pp. 11-1 through 11-21, undated.

BDM/JTAG Debug Interfaces, http://www.abatronag.ch, 6 pages, Feb. 2000.

Multi-ICE™ Interface Unit, wysiwyg://4/http://www.arm.com, pp. 1-4, 2000.

Summit-ICE PCI Emulator, http://www.wmdsp.com, 1 page, 1998.

Mountain-ICE/WS JTAG Emulator-SBus, http://www.wmdsp.com, pp. 1-2, 1998.

Mountain-ICE JTAG Emulator-PC-ISA, http://www.wmdsp.com, pp. 1-2, 1998.

\* cited by examiner

CONTROL METHOD AND APPARATUS FOR TESTING OF MULTIPLE PROCESSOR INTEGRATED CIRCUITS AND OTHER DIGITAL SYSTEMS

FIELD OF THE INVENTION

The present invention relates generally to integrated circuits and other types of digital systems, and more particularly to techniques for testing such systems.

BACKGROUND OF THE INVENTION

A well-known standard for use in testing integrated circuits and other types of digital systems has been developed by the Joint Test Action Group (JTAG) and is defined in Institute of Electrical and Electronics Engineers (IEEE) Standard 1149.1, "IEEE Standard Test Access Port and Boundary Scan Architecture," IEEE, New York, N.Y., October, 1993, which is incorporated by reference herein. For example, in the context of an integrated circuit, the IEEE 1149.1 standard defines test logic that can be included in an integrated circuit to provide standardized approaches to testing the interconnections between integrated circuits once they have been assembled onto a printed circuit board or other substrate, testing the integrated circuit itself, and observing or modifying circuit activity during normal circuit operation. The test logic includes a boundary-scan register as well as other elements and is accessible through a Test Access Port (TAP) associated with the integrated circuit. The test logic allows test instructions and associated test data to be fed into the integrated circuit, and allows the results of execution of the instructions to be subsequently read out. All information, i.e., test instructions, test data and test results, are communicated in a serial format. The integrated circuit test process is also commonly referred to as "debugging."

Many recently-developed integrated circuits include multiple processors configured to implement a variety of so-called "system on a chip" solutions. The processor cores may be homogeneous, i.e., have the same processor architecture, or heterogeneous, i.e., have different processor architectures. The higher levels of integration associated with such multiple processor devices generally require additional package input/output (I/O) capacity, i.e., additional package pins and associated internal bonding pads, wiring etc. However, this requirement is in conflict with other requirements, such as portable operation, that generally require lower power and thus a lower package I/O capacity. As a result, it is important that the integrated circuit test functions utilize as few pins as possible.

The above-described IEEE 1149.1 standard has been used successfully to minimize I/O capacity requirements for debug access to integrated circuits with a single processor core or multiple homogeneous processor cores on the same scan chain.

For example, a conventional approach to debugging of an integrated circuit with multiple homogeneous processors is described in L. Goudge, "Debugging Embedded Systems," ARM White Paper, www.arm.com, 1998. In this approach, if a user wishes to examine the state of more than one processor during a debugging session, then this may be achieved synchronously by setting up "debug halt" conditions independently within each processor while the system is running. Through use of the TAP controller state machine, all of the processors may then be stopped simultaneously. Similarly, at the end of the debugging session, "debug restart" conditions may be set up in each processor and again through use of the state machine, the processors may be restarted simultaneously. This approach requires that all of the processors be homogeneous, and all of the processors must be involved in the condition setting in order to provide the synchronous stopping and restarting.

Another conventional approach for IEEE 1149.1 testing of an integrated circuit with homogeneous processors is the ScanProgrammer from ASSET InterTech, www.asset-intertech.com. This approach uses a single database that is loaded with Serial Vector Format (SVF) data to assemble scans for an IEEE 1149.1 scan chain.

Yet another known approach is the Global Embedded Processor Debug Interface Standard (GEPDIS), www.ieee-isto.org/Nexus5001, which describes the Nexus 5001 Forum™ Standard for a global embedded processor debug interface. This is an open industry standard that provides a general-purpose interface for the software development and debug of embedded processors.

A number of significant problems arise in the application of the IEEE 1149.1 standard to integrated circuits and other types of digital systems which include multiple heterogeneous processors. For example, conventional application of the IEEE 1149.1 standard to multiple heterogeneous processors often requires that a TAP controller for one or more of the processors be redesigned to support asynchronous control. This may require modifications of components not designed to be easily modified or tested. Other conventional approaches may require special hardware to mediate access to multiple TAP controllers in a manner that often violates the IEEE 1149.1 standard and does not easily allow for synchronous control of the multiple processors.

A possible software approach to the problems associated with testing multiple heterogeneous processors is to build a debugger that treats the target system as a single device and merges stand-alone debug systems for all of the devices to be controlled. Unfortunately, the drawbacks of this approach are numerous. For example, the source code for each debug system must be modified, and this source code can be difficult to access. In addition, the resulting debugger supports only one or at most a handful of combinations of devices. Furthermore, upgrades to the stand-alone debug systems must be laboriously reintegrated into the merged debugger.

In view of the foregoing, it is apparent that a need exists for an improved control mechanism for use in testing of integrated circuits and other types of digital systems which incorporate multiple and possibly heterogenous processors.

SUMMARY OF THE INVENTION

The present invention provides a control mechanism for use in testing of integrated circuits and other digital systems which incorporate multiple processors.

In accordance with the invention, the control mechanism dynamically defines a group of processors subject to common control, e.g., at the direction of a debugger program associated with a debug client. The control mechanism then receives one or more commands for each of the processors in the group, and delays issuance of at least a subset of the commands for the group until a designated group scan command is received for each of the processors in the group.

The control mechanism may be in the form of a software-implemented chain manager which provides the above-noted group definition, command receipt and issuance delay operations, and subsequently delivers the commands as a single serial bit stream to an IEEE 1149.1 hardware scan chain associated with the processors. The control mechanism can provide synchronous control for a group of homogeneous processors, or pseudo-synchronous control for a group of heterogeneous processors.

As noted previously, the group of processors may be defined in response to a group request received from a debugger. The chain manager in this case defines the group by, e.g., establishing a group identifier for the group, storing the group identifier and a size of the group, and returning the group identifier to the debugger.

The test commands for each of the processors in a given group may be generated by a Test Access Port (TAP) manager associated with the corresponding processor. Each processor and its corresponding TAP manager is a member of only one group at a given point in time, but can be members of different groups of processors at different points in time.

The control mechanism, which may be advantageously implemented in software, allows the multiple processors to perform synchronous or pseudo-synchronous operations without requiring excessive coupling between individual processor debug systems as in the above-described conventional approaches. In addition, the processor grouping can be altered dynamically to allow for multiple groups of processors on the same scan chain and the alterations of these groups during a single debugging session. The control mechanism of the present invention is thus reusable for different numbers and arrangements of processors, and is also scalable for use with any desired number of processors.

DETAILED DESCRIPTION OF THE INVENTION

The present invention will be illustrated herein in the context of a exemplary multiple processor system. It should be understood that the invention is more generally applicable to any type of digital system which includes two or more processors. The term "processor" as used herein is intended to include not only programmable processors such as microprocessors or digital signal processors (DSPs), but more generally any type of digital logic function that may be controlled by a scan chain. The term "digital system" is intended to include a single integrated circuit, a set of two or more integrated circuits, or other types and arrangements of devices which collectively incorporate two or more processors.

Figure 1:
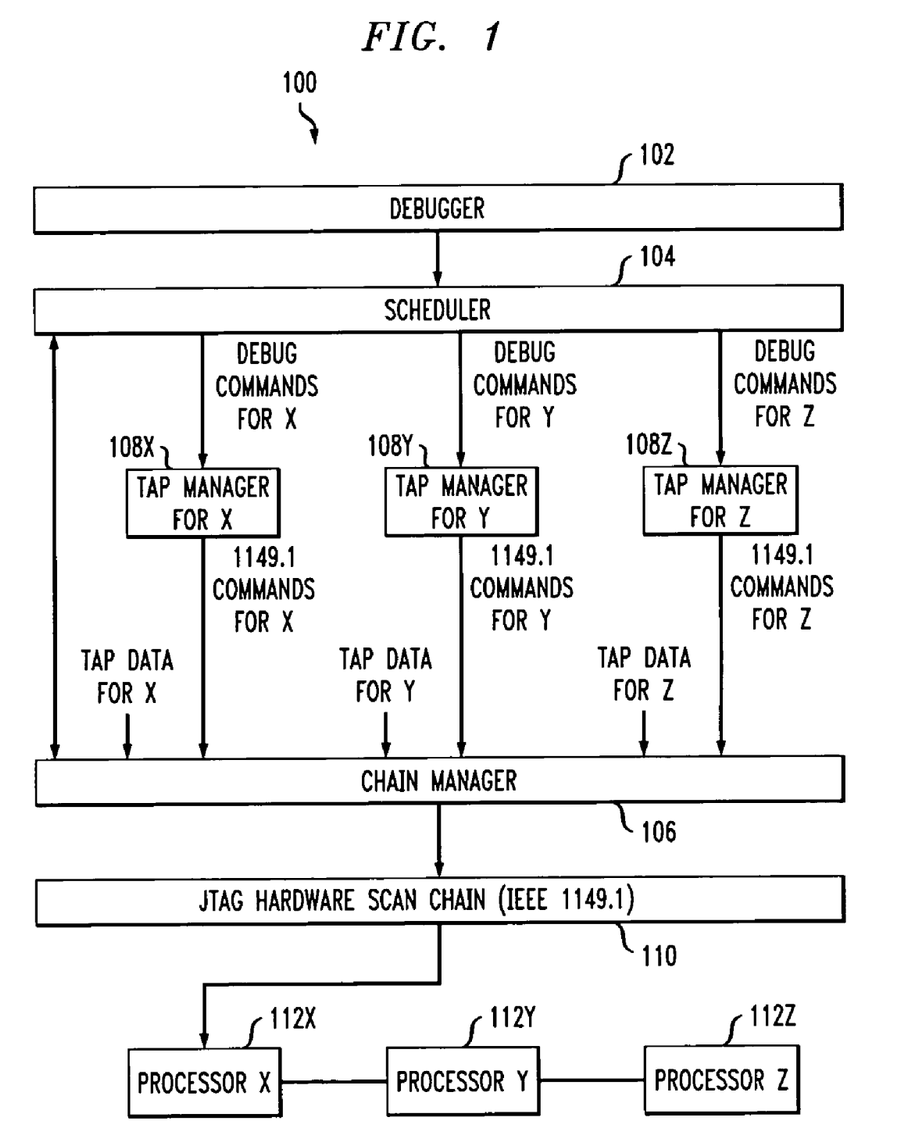
FIG. 1 shows an illustrative embodiment of a system which incorporates a mechanism for control of multiple processors in accordance with the invention.

FIG. 1 shows a multiple processor test system 100 which includes a debugger 102, a scheduler 104, and a chain manager 106. Coupled between the scheduler 104 and the chain manager 106 is a set of Test Access Port (TAP) managers 108X, 108Y and 108Z, each associated with a corresponding one of three processors X, Y and Z. The system 100 further includes a Joint Test Action Group (JTAG) hardware scan chain 110 configured in accordance with the above-described IEEE 1149.1 standard. The scan chain 110 is coupled to a series connection of the three processors X, Y and Z, also denoted as elements 112x, 112Y and 112Z, respectively, in the figure. The processors X, Y and Z and the corresponding scan chain 110 are part of one or more integrated circuits or another type of digital system to be tested. The chain manager 106 is also referred to herein as a JTAG chain manager.

The scheduler 104 supplies debug commands for the processors X, Y and Z to the corresponding TAP managers 108X, 108Y and 108Z, respectively. The TAP managers generate IEEE 1149.1 commands for each of the processors, and these commands are supplied along with TAP data for each of the processors to the chain manager 106.

The operation of the system 100 will now be described for a given test configuration involving a designated group of the multiple processors. The debugger 102 via the scheduler 104 asks the chain manager 106 for a group identifier (GROUP ID) for a group of known size. A particular member of a group refers generally to one of the processors and its corresponding TAP manager. The chain manager 106 issues a GROUP ID and stores that GROUP ID as well as the size of the group. This GROUP ID is passed back to the debugger 102. Each of the TAP managers 108X, 108Y and 108Z includes a device-specific program for its corresponding processor, and issues one or more IEEE 1149.1 scan commands ending with a group scan command which may be, e.g., an instruction register (IR) command and/or a data register (DR) command.

A group scan command in the illustrative embodiment refers generally to a final JTAG scan command that occurs before a desired synchronous or pseudo-synchronous behavior. The group scan command generated by one of the TAP managers in a group is delayed by the chain manager 106 until the TAP managers for all other group members issue a group scan command. The individual commands of the groups are then merged, and synchronously and simultaneously scanned into the scan chain 110 by the chain manager 106.

The chain manager 106 thus delays the issuance of the group scan commands for the members of the group until all members of the group arrive at an equivalent state in their control sequences.

It is important to note that the individual TAP managers have no knowledge of the group size. The group size in the illustrative embodiment of FIG. 1 may be one, two or three. Although only three processors are shown in this example, it should be understood that the control mechanism of the invention may be applied to any desired number of processors in other embodiments. Moreover, the processors in a given group may be homogeneous or heterogeneous. Group membership is dynamic, and each processor and its corresponding TAP manager may be a member of different groups at different times. Each processor and its corresponding TAP Manager is only a member of one group at a time.

The scheduler 104 instantiates a TAP Manager for each physical processor that is being tested on the single IEEE 1149.1 hardware scan chain 110. The scan chain 110 may include other processors that are not being tested. The debugger 102 sends to the scheduler 104 commands that carry the above-noted GROUP ID. The scheduler 104 removes the GROUP ID from a TAP request going to one of the TAP managers and passes the GROUP ID to the chain manager 106. The chain manager 106 then stores the GROUP ID in a TAP Data class hidden from the corresponding TAP manager. The chain manager 106 is preloaded with the group size but not the group membership information. Each TAP manager issues multiple commands to the chain manager 106 to satisfy the TAP request for the physical processor it controls.

As noted previously, the last command issued by a given TAP manager is a group scan command. After a group scan command is issued by a given TAP manager, the chain manager 106 places the corresponding processor under test in a passive state, e.g., an IEEE 1149.1 bypass state, until all group members have requested the group scan. In this passive state, the processor is generally not interacting with the scan chain. When all group members have requested the group scan, the chain manager 106 commences with the group scan, and then deallocates all group resources, effectively dissolving the group. The system user may select synchronous or asynchronous group control of the processor group for commands such as run, resume, step, step-n, halt, and halt at breakpoint. All knowledge of the processor-specific IEEE 1149.1 interface for a given processor is contained in the corresponding TAP manager program.

An operator of the system 100 of FIG. 1, also referred to herein as a debug client, can utilize the control mechanism of the present invention to support different sets of semantics for multiple processors, such that commands (e.g., reset, start, step, halt, etc.) issued to a command window of a particular processor affect only that processor, while commands issued to a command window of a specified group of the processors affect all processors of the group simultaneously.

Figure 2:
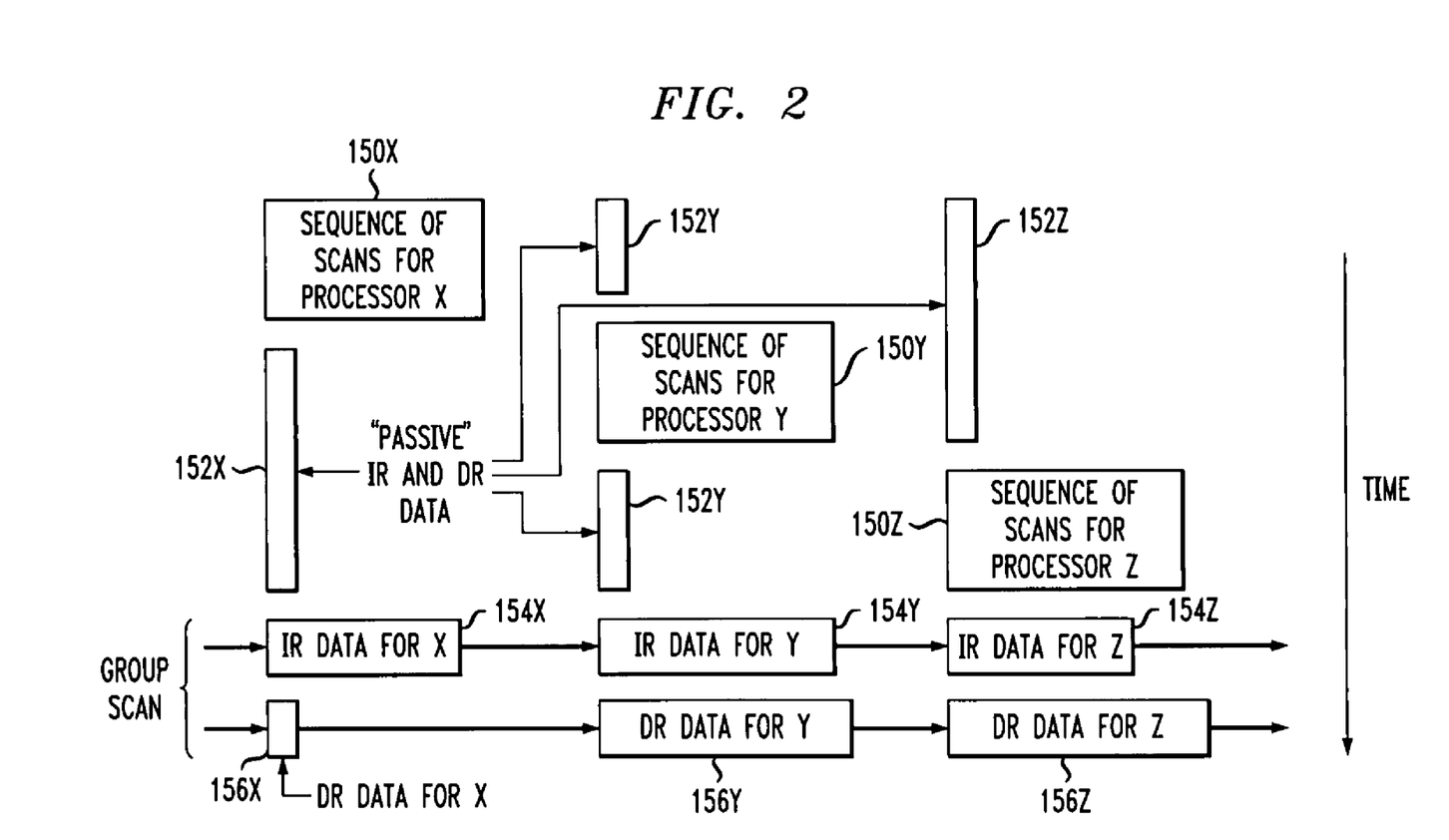
FIG. 2 is a diagram showing an example of the processing of test commands in the illustrative embodiment of the invention.

FIG. 2 illustrates in greater detail the above-described processing of test commands in the FIG. 1 system. The figure shows sequences of individual scans 150X, 150Y and 150Z for each of the processors X, Y and Z, respectively, as a function of time. Associated with each of the sequences of scans 150X, 150Y and 150Z are corresponding sets of passive IR and DR data 152X, 152Y and 152Z, respectively. As is apparent from the figure, the individual scan sequences and associated passive data are each delivered to a particular processor. The figure also shows an example of a group scan which includes two components: an IR scan involving IR data 154X, 154Y and 154Z, and a DR scan involving DR data 156X, 156Y and 156Z.

It should again be emphasized that the above-described control mechanism may be utilized in any type of multiple processor digital system, and is not limited to use with any particular number, type or arrangement of processors. An example of a multiple processor system in which the invention may be implemented is the TargetView™ system from Lucent Technologies Microelectronics Group of Allentown, Pa.

A possible IEEE 1149.1 state sequence for a group scan of the type described above in conjunction with FIG. 1 is as follows:
Run-Test-Idle
Select-Dr-Scan
Select-Ir-Scan
Capture-Ir
Shift-Ir
Exit1-Ir
Update-Ir
Select-Dr-Scan
Capture-Dr
Shift-Dr
Exit1-Dr
Update-Dr Type I processors begin interpreting DR data here
Run-Test-Idle Type II processors begin interpreting IR data here Additional details regarding these states can be found in the above-cited IEEE 1149.1 standard document. The notations Type I and Type II refer generally to different processor architectures, i.e., Type I is a first type of processor architecture and Type II is a second type of processor architecture. Thus, a group of processors which includes only Type I or Type II processors is a group of homogenous processors, while a group which includes both Type I and Type II processors is a group of heterogenous processors.

Referring again to FIG. 2, the IR scan component of the group scan illustrated therein may be used, e.g., to prepare Type II processors for synchronous or pseudo-synchronous operation, or to select an appropriate DR for Type I processors. The DR scan component of the group scan of FIG. 2 may be used, e.g., to synchronize Type I processors, such that when the processor TAP managers return to the Run-Test-Idle state all Type II devices are synchronized.

Consider by way of example an arrangement in which the group of processors in the FIG. 1 system consists of only homogeneous processors. In this example, synchronous control may be provided as follows:
GROUP-RUN Type I processors.
Each processor is prepared for the final group command.
When the last group member issues its group command, all physical processors simultaneously receive their group command at the IEEE 1149.1 UPDATE-DR state. Since all processors share a common IEEE 1149.1 test clock, all processors start on the same clock edge.
GROUP-RUN Type II processors.
Each processor is prepared for the final group command.
When the last group member issues its group command, all physical processors simultaneously receive their group command at the IEEE 1149.1 RUN-TEST-IDLE state. Since all processors share a common IEEE 1149.1 test clock, all processors start on the same clock edge.

As another example, pseudo-synchronous control may be provided for a group of heterogeneous devices in the FIG. 1 system as follows:
GROUP-RUN Type I and Type II processors.
Each processor is prepared for the final group command.
When the last group member issues its group command, one or more Type I processors receive the group command at the IEEE 1149.1 UPDATE-DR state. One IEEE 1149.1 test clock cycle later at the IEEE 1149.1 RUN-TEST-IDLE state, the Type II processors in the group receive the group command. Each of the Type I processors thus operates on the same clock edge, while each of the Type II processors operates on the next clock edge. This is an example of the pseudo-synchronous control referred to herein.

Figure 3:
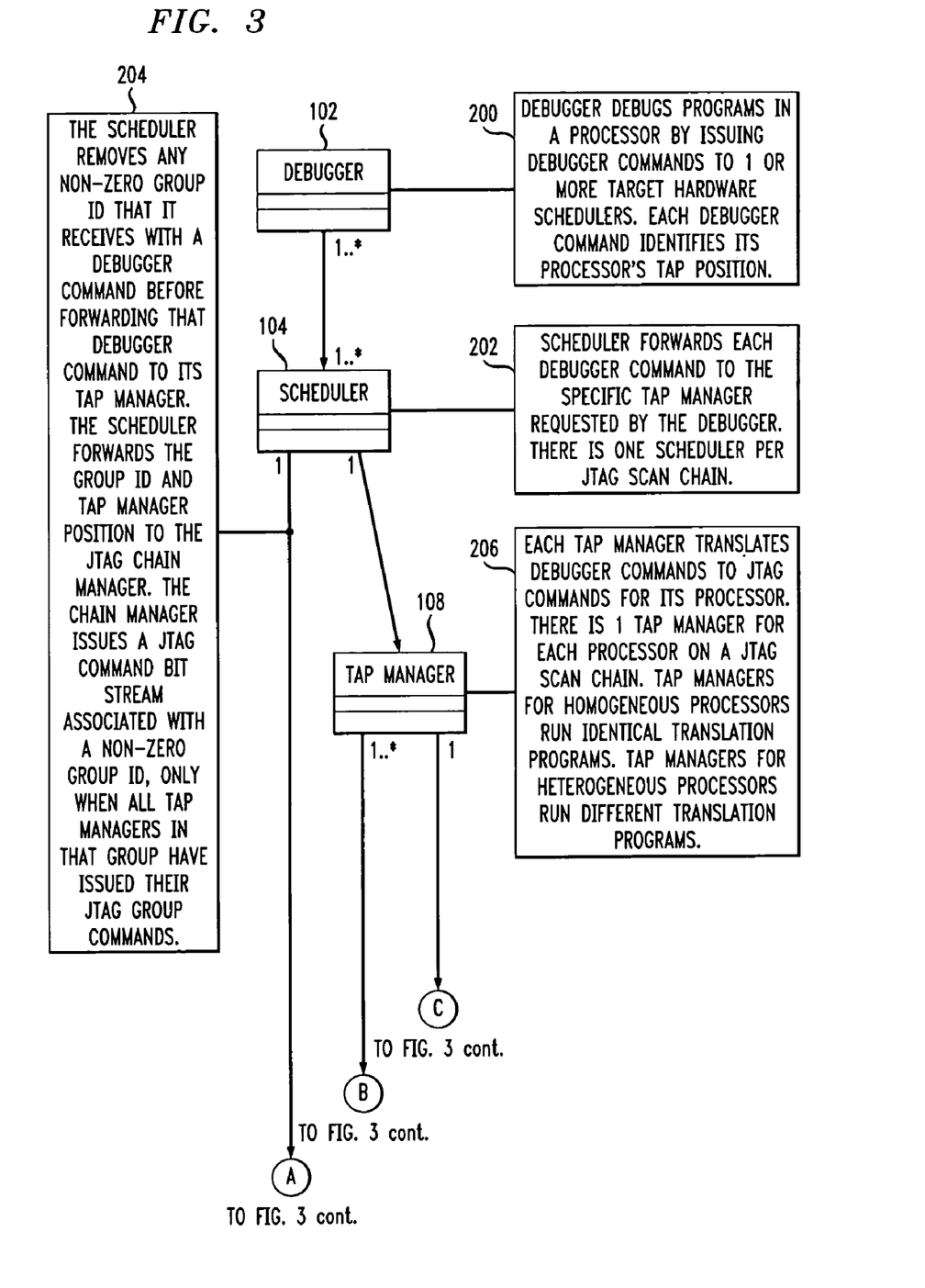
FIG. 3 is a functional diagram illustrating the operation of the FIG. 1 control mechanism.

FIG. 3 illustrates the above-described control mechanism in greater detail. In the figure, the notation "1" signifies a single element, and "1 . . . *" signifies one or more elements. For example, one scheduler schedules one or more TAP managers, and one JTAG chain manager receives JTAG commands from one or more TAP managers.

In step 200 of FIG. 3, debugger 102 debugs programs in a processor by issuing debugger commands to one or more target hardware schedulers 104. Each debugger command identifies the TAP position of its processor. In step 202, the scheduler 104 forwards each debugger command to the specific TAP manager 108 requested by the debugger 102. It should be noted that there is one scheduler 104 per JTAG scan chain.

As indicated in step 204, the scheduler 104 removes any non-zero GROUP ID that it receives with a debugger command before forwarding that debugger command to its corresponding TAP manager. The scheduler forwards the GROUP ID and TAP manager position to the JTAG chain manager 106. The chain manager 106 issues a JTAG command bit stream for a group scan associated with a non-zero GROUP ID only when all TAP managers in that group have issued their JTAG group scan commands.

In step 206, each TAP manager translates debugger commands to JTAG commands for its processor. There is one TAP manager for each processor on a JTAG scan chain. In general, TAP managers for homogenous processors run identical translation programs, while TAP managers for heterogeneous processors run different translation programs.

Step 208 indicates that the chain manager 106 merges JTAG commands from each TAP manager into one sequence of bits for the serial JTAG scan chain 110. The chain manager 106 defers issuing a JTAG group scan command that carries a non-zero GROUP ID until every TAP manager in that group has issued a JTAG group scan command. When the final TAP manager in a group issues a group scan command, the chain manager 106 uses a single, synchronous bit stream to issue commands to all processors on the scan chain that are in that group.

In step 210, the hardware scan chain 110 carries JTAG commands as a serial, synchronous bit stream to processors connected to the chain. Step 212 indicates that each processor in the scan chain either interprets or ignores (e.g., bypasses) JTAG commands sent to that processor via the scan chain. There is a one-to-one correspondence between each processor and its TAP manager, but their electrical connection is via the JTAG scan chain 110.

Figure 4:
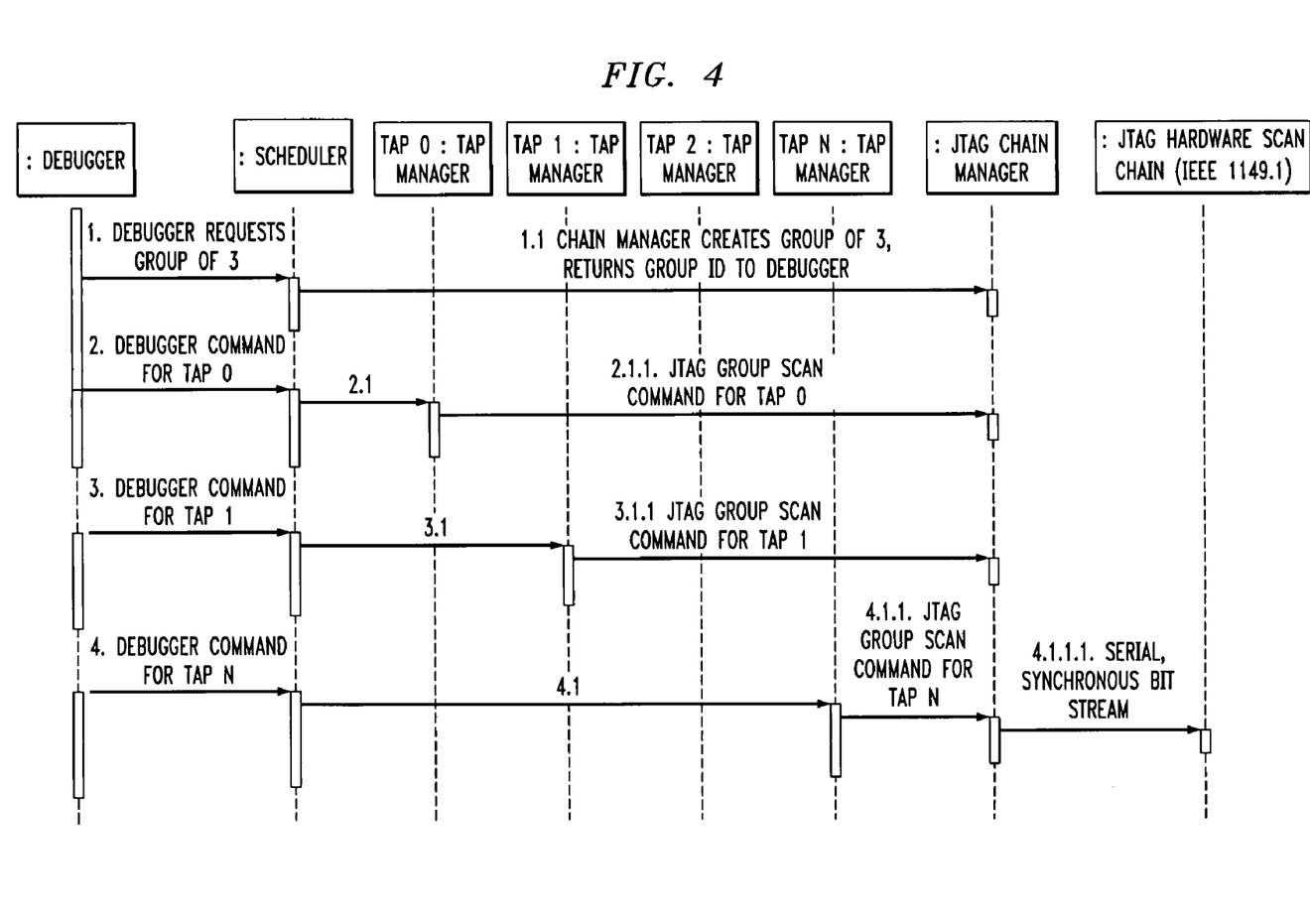
FIG. 4 is a timing diagram for a particular example implementation of a control mechanism in accordance with the invention.

FIG. 4 shows a timing diagram of a group scan for an example usage scenario of the control mechanism of the present invention. In this example, it is assumed that debugger 102 issues a command to each of a group of TAP managers denoted TAP 0, TAP 1 and TAP N, corresponding to respective processors 0, 1 and N, using a single non-zero GROUP ID. Each TAP manager translates its debugger command into a sequence of JTAG commands, but the JTAG chain manager 106 delays issuing the final group scan JTAG commands onto the JTAG hardware scan chain 110 until the arrival of the final JTAG command for TAP N, i.e., the group scan command for TAP N. The JTAG chain manager then issues the JTAG group scan commands for processors 0, 1 and N on the scan chain as a single synchronous bit stream. As a result, initiation or termination of processor execution, or of any other processor operation controlled by JTAG commands, is synchronized or pseudo-synchronized for processors 0, 1 and N. In the figure, full arrows denote operations that execute when requested. Half arrows denote operations that the JTAG chain manager defers until all JTAG group scan commands for a specific non-zero GROUP ID have arrived at the JTAG chain manager. The JTAG chain manager 106 thus defers transmission of the JTAG command bit stream onto the JTAG hardware scan chain until the arrival of the final JTAG command for a group of processors with a shared GROUP ID. Advantageously, the control mechanism of the present invention may be implemented in software. The above-described control mechanism of the present invention allows dynamic formations of groups of processors with differing IEEE 1149.1 TAP architectures, e.g., Type I or Type II architectures, so as to allow the processors to be controlled synchronously or pseudo-synchronously by a debug client. All mechanics of group control are handled in the illustrative embodiments by the chain manager so that the debug client can define the semantics of group interaction at run time.

The above-described embodiments of the invention are intended to be illustrative only. Numerous other alternative embodiments may be devised by those skilled in the art without departing from the scope of the following claims. For example, the invention may be used to test digital systems which are implemented in software and downloaded into a set of hardware which is known to be operating correctly. These and other alternative embodiments will be readily apparent to those skilled in the art.

What is claimed is:

1. A method of testing a digital system comprising a plurality of processors, the method comprising the steps of:
   defining at least a subset of the processors as forming a group of processors to be subject to common control; and
   delaying issuance of one or more commands for the group until a group scan command is received for each of the processors in the group.

2. The method of claim 1 wherein the defining step includes defining the group of processors in a chain manager in response to a group request received from a debugger.

3. The method of claim 2 wherein the chain manager establishes a group identifier for the group, stores the group identifier and a size of the group, and returns the group identifier to the debugger.

4. The method of claim 1 wherein the commands comprise commands configured in accordance with the IEEE 1149.1 standard.

5. The method of claim 1 wherein the group scan commands for each of the processors in the group are generated by a Test Access Port (TAP) manager associated with the corresponding processor.

6. The method of claim 5 wherein each processor and its corresponding TAP manager is a member of only one group at a given point in time.

7. The method of claim 5 wherein each processor and its corresponding TAP manager is a member of different groups of processors at different points in time.

8. The method of claim 1 wherein the group of processors comprises a group of homogeneous processors.

9. The method of claim 8 wherein the delaying step provides synchronous control for the group of homogeneous processors.

10. The method of claim 1 wherein the group of processors comprises a group of heterogeneous processors.

11. The method of claim 10 wherein the delaying step provides pseudo-synchronous control for the group of heterogeneous processors.

12. The method of claim 1 wherein one or more of the group scan commands for each of the processors in the group of processors are supplied as a single serial bit stream to a hardware scan chain associated with the processors.

13. An apparatus for use in testing a digital system comprising a plurality of processors, the apparatus comprising:
   a chain manager operative to define at least a subset of the processors as forming a group of processors to be subject to common control, and to delay issuance of one or more commands for the group until a group scan command is received for each of the processors in the group.

14. The apparatus of claim 13 wherein the chain manager is implemented at least in part in software.

15. An apparatus for use in testing a digital system comprising a plurality of processors, the apparatus comprising:
- a debugger;
- a scheduler coupled to the debugger and operative to generate in response to signals from the debugger a set of debug commands for the processors;
- at least one test command generator coupled to the scheduler and operative to generate test commands from the debug commands;
- a chain manager coupled to the command generator and operative to define at least a subset of the processors as forming a group of processors to be subject to common control, to receive one or more of the test commands for each of the processors in the group, and to delay issuance of at least a subset of the test commands for the group until a designated group scan command is received for each of the processors in the group.

16. The apparatus of claim 15 further comprising a plurality of test command generators, with one of the test command generators associated with each of the processors.

17. The apparatus of claim 15 wherein one or more of the group scan commands for each of the processors in the group of processors are supplied by the chain manager as a single serial bit stream to a hardware scan chain associated with the processors.

18. The apparatus of claim 15 wherein the chain manager is implemented at least in part in software.

19. A method of testing a digital system comprising a plurality of processors, the method comprising the steps of:
- defining at least a subset of the processors as forming a group of processors to be subject to common control;
- receiving one or more commands for each of the processors in the group; and
- delaying issuance of at least a subset of the commands for the group until a group scan command is received for each of the processors in the group.

20. An apparatus for use in testing a digital system comprising a plurality of processors, the apparatus comprising:
- a chain manager operative to define at least a subset of the processors as forming a group of processors to be subject to common control, to receive one or more commands for each of the processors in the group, and to delay issuance of the commands for the group until a designated group scan command is received for each of the processors in the group.

* * * * *